United States Patent [19]

Mulliner et al.

[11] Patent Number: 4,591,088
[45] Date of Patent: * May 27, 1986

[54] SOLDER REFLOW PROCESS FOR SOLDERING SHAPED ARTICLES TOGETHER

[75] Inventors: Richard R. Mulliner; James S. Ajioka, both of Fullerton, Calif.

[73] Assignee: Hughes Aircraft Company, Los Angeles, Calif.

[ * ] Notice: The portion of the term of this patent subsequent to Jan. 22, 2002 has been disclaimed.

[21] Appl. No.: 666,952

[22] Filed: Oct. 31, 1984

Related U.S. Application Data

[62] Division of Ser. No. 499,746, May 31, 1983, Pat. No. 4,499,157.

[51] Int. Cl.$^4$ .............................................. B23K 1/00
[52] U.S. Cl. ................................... 228/121; 228/124; 228/208; 228/240; 29/600
[58] Field of Search ............... 228/120, 121, 122, 124, 228/180.1, 240, 208; 428/458, 901; 29/600

[56] References Cited

U.S. PATENT DOCUMENTS

| | | | |
|---|---|---|---|
| 3,195,079 | 7/1965 | Burton | 29/600 |
| 3,214,827 | 11/1965 | Phohofsky | 228/180.1 |
| 3,354,129 | 11/1967 | Edmonds, Jr. et al. | 260/79 |
| 3,681,209 | 8/1972 | Campbell et al. | 204/30 |
| 3,733,694 | 5/1973 | Vlietstra | 228/122 |
| 3,953,653 | 4/1976 | Doss | 428/419 |
| 4,187,974 | 2/1980 | Mahajan | 228/242 |
| 4,192,764 | 3/1980 | Madsen | 430/455 |
| 4,248,921 | 2/1981 | Steigerwald | 428/148 |
| 4,296,217 | 10/1981 | Stuart-Webb | 525/390 |
| 4,334,646 | 6/1982 | Campbell | 228/242 |
| 4,335,164 | 6/1982 | Dillard et al. | 427/304 |
| 4,353,954 | 10/1982 | Yamaoka | 428/458 |
| 4,358,503 | 11/1982 | Homeyer | 428/285 |
| 4,407,883 | 10/1983 | Newton | 428/458 |
| 4,410,388 | 10/1983 | Oizumi | 428/901 |
| 4,424,254 | 1/1984 | Hedrick | 428/366 |
| 4,444,836 | 4/1984 | Khattab | 428/458 |
| 4,492,730 | 1/1985 | Oishi | 428/458 |
| 4,495,253 | 1/1985 | Abel | 428/419 |

FOREIGN PATENT DOCUMENTS 2015414 2/1979 United Kingdom .

OTHER PUBLICATIONS

D. J. Levy and D. H. Ma, Interfacial Bonding of Nickel to Polyamideimide, Plating & Surface Finishing, Jun. 1979, pp. 68-71.
Modern Plastics Encyclopedia, Oct. 1980, vol. 57, Number 10A, pp. 3, 46, 73, 74, 120, 122, 124, 184, 185, 451-454, 546, 552, and 555.

Primary Examiner—Nicholas P. Godici
Assistant Examiner—C. McKee
Attorney, Agent, or Firm—Thomas A. Runk; Anthony W. Karambelas

[57] ABSTRACT

A particular plastic material is formed into the desired component shape and then is plated by a process comprising; a particular surface preparation step, electroless deposition and electrolytic deposition which results in excellent plating adhesion. The plated component is then assembled with other components manufactured in the same manner or with compatible metal components such as aluminum and soldered together in a disclosed hot oil dip soldering process. In the soldering process, the plated plastic substrate is completely immersed in a hot oil medium at a temperature of approximately 243° C. (470° F.) for a time of approximately 60 seconds for solder reflow.

43 Claims, 2 Drawing Figures

SOLDER REFLOW PROCESS FOR SOLDERING SHAPED ARTICLES TOGETHER

The Government has rights to this invention pursuant to Contract No. N00-123-81-C-1171 awarded by the Department of the Navy, Naval Ocean Systems Center.

This is a division of application Ser. No. 499,746 filed May 31, 1983, now U.S. Pat. No. 4,499,157.

BACKGROUND OF THE INVENTION

The invention relates to the field of plated plastic materials and, more particularly, to the metallic plating of certain plastic materials such that the plated article is solderable in a hot oil dip soldering process or a vapor phase soldering process.

Metal plated plastic materials are desirable in many applications due to their relatively low weight, relatively low cost and the relative ease and predictability of reproduction. Certain areas of the electronics industry are particularly suited for the application of metal plated plastic components. For example, a shipboard radar antenna which must be placed high in the ship's structure would be more desirable if its weight were minimized. Placing heavy antennas in high places on the ship will have the result of shifting upward the center of gravity position and will require offsetting amounts of weight placed below the water line. These additions of antenna weight and offsetting ballast weight have obvious disadvantages such as reduced speed of the ship, reduced range of the ship, degraded maneuvering capability, etc. The typical lower weight of plated plastic components many of which are of less weight than aluminum, used in a radar antenna application such as the above, could significantly lessen the overall ship weight gain. Likewise, reducing the weight of an aircraft radar system would have the obvious advantages of permitting flight at faster speeds, better maneuverability, range, etc.

Phased array antennas generally use a multitude of simple waveguide assemblies such as corporate feeds, sinuous feeds, multiport power dividers, diplexers, slotted radiators, etc. The costs of the manufacture and assembly of these components in the quantities used in many phased arrays can cause the overall cost of the antenna to be prohibitively high. Also, the weight of the antenna is substantial when these components are manufactured from metal materials.

Many of these assemblies are customarily manufactured from aluminum and are assembled using dip brazing techniques. In the dip brazing technique, a high temperature is used, i.e., above 538° C. (1000° F.), which typically distorts the aluminum part and requires subsequent steps of straightening, heat treating, cleaning and in some cases, machining the surfaces to obtain acceptable matching characteristics. Because of these requirements, repairs are generally not possible. The defective part typically must be cut away from the other parts and replaced if tolerances will permit. In addition, equipment costs for dip brazing are relatively high.

Using metal plated plastic electronic components in applications such as the waveguide assemblies described above would be of great value in the electronics area. Both the expense and weight of the assemblies would be reduced. However these metal plated plastic components should be compatible with aluminum and a process for interfacing them with aluminum would be required.

Plated plastic articles and processes for manufacturing them are well known in the art. For example, U.S. Pat. Nos. 4,148,945 and 4,078,096 both disclose processes for plating certain plastic materials. However, the products of these processes have thus far, not been suitable for the applications discussed above. As an example, if a waveguide feed and flange assembly is to be manufactured either partially or completely from plated plastics, certain characteristics of the plastic and its metallic plating would be required. The plated plastic must have the same thermal coefficient of expansion as the materials with which it will interface, compatible electrical properties and comparable strength characteristics. The plating must have good adhesion to the plastic material so that environmental stresses do not cause plating degradation with accompanying changes in electrical performance. The plated plastic components should be assemblable with each other and should be assemblable with metallic components in such a way that a solid joint is formed and electrical continuity is maintained where required. In some cases, such as where waveguides are to be formed of the plated plastic, it may be required that the joints be of high quality so as not to cause arcing within the waveguide.

The ability to solder plated plastics together or with aluminum would be very desirable. When used in a military application, plated plastic components must be consistent with interfacing metal components such as aluminum in order to satisfy military use standards. In regard to the above requirements, U.S. Pat. No. 4,148,945 discloses are of acrylonitrile/butadiene/styrene (commonly called ABS) as the plastic substrate material. This plastic typically has a low melting temperature, approximately 118° C. (245° F.), (see the Modern Plastics Encyclopedia, 1979, Vol. 56, No. 10A, pg 498), and had not been found to be suitable for soldering processes such as hot oil dip or vapor phase since it melts at the soldering temperature. U.S. Pat. No. 4,078,096 discloses the use of a polyimide polymer which, it is claimed, will withstand immersions (10-15 seconds) in a solder pot at 232°-246° C. (450°-475° F.). The melting temperature of this plastic is higher than ABS, however prior processes for metal plating have resulted in adhesion of the plating with peel strengths which are relatively low (less than 5 lbs./in.).

Many prior plated plastics are solderable using techniques such as wave soldering, soldering irons and other similar methods where the plastic substrate is not immersed in a relatively hot medium for an extended period. However in applications such as joining a waveguide flange to a waveguide section, an immersion soldering process, such as hot oil dip or vapor phase is very desirable since a fully flowed solder joint is obtained. However prior metal plated plastic materials have not been capable of withstanding a hot oil dip soldering process at temperatures around 243° C. (470° F.) for 60 seconds or more without experiencing either a deformation in or destruction of the substrate material or a degradation of the adhesion of the plating material to the substrate resulting in partial or complete delamination.

In view of the above, it would be a valuable contribution to the art to provide hot oil dip or vapor phase solderable, plated plastic components which are solderable to and compatible with like plated plastic components and with interfacing metal components such as aluminum.

SUMMARY OF THE INVENTION

Accordingly, it is a purpose of the invention to provide light and less costly components manufactured of a plated high temperature and high strength plastic material which are capable of withstanding a sustained high temperature soldering process such as hot oil dip and vapor phase and which are usable in a wide variety of applications including the electronics area.

It is also a purpose of the invention to provide metal plated plastic components where the metal plating has an adhesion quality which will resist peeling when subjected to the wide range of temperature, corrosion, electrical, vibration and other environments associated with military applications.

It is also a purpose of the invention to provide a process for soldering plated plastic components with other plated plastic components or with compatible metal components such as aluminum.

It is also a purpose of the invention to provide plated plastic components which are usable in electrical applications such as waveguide components.

By this invention, a group of plastics may now be utilized to manufacture components which can compatibly interface with metallic components and which are hot oil dip or vapor phase solderable. The invention depends upon using certain plastic materials, in particular, plastics which are high temperature, i.e., have melting and deflection temperatures above approximately 204° C. (400° F.), are high strength and have a thermal coefficient of expansion similar to metal components it may interface with, such as aluminum. These plastics are usable in a wide variety of applications because they can be metal plated with resultant high peel and shear strengths when plated in accordance with the process disclosed herein. In addition, these plastics are very stable dimensionally (shrinkage is relatively little and is predictable), and have a low water absorption quality. Also the plastics have good tensile strength and good impact strength to withstand environmental loads especially in rugged military environments.

The plastic is formed into the desired component shape by molding, machining or by other means known in the art. Then it is plated by a process which results in strong adhesion of the plating to the plastic substrate. The plating process comprises the basic steps of drying the substrate by baking, preparing the surface to accept plating by blasting with grit and chemical etching, applying a first layer of copper or other metal by electroless deposition, and applying a thicker layer of copper or other metal through electrolytic deposition.

Due to the characteristics of the plated plastic component resulting from the combination of the particular high temperature/high strength plastic with the disclosed plating process, the plastic component may now be soldered to other like components or to compatible metal components using a hot oil, dip soldering process or a vapor phase process. A new hot oil, dip soldering process has been developed which yields excellent results. A preplating of solder or a solder foil technique is used with immersion into hot oil resulting in solder joints stronger than the underlying metallic plating. The basic steps of the process are drying the plated plastic material by baking, applying flux, applying solder to the mating surfaces, assembling the components, dipping the components in hot oil which is at a temperature of approximately 243° C. (470° F.), sustaining immersion in the hot oil until the solder has completely reflowed, rinsing and drying the assembled structure. Assemblies and components made in accordance with the invention satisfy military environmental requirements and are usable in a wide variety of applications including the electronics area in components such as waveguide assemblies. The peel strength of the plating is excellent and solder joints are stronger than the adhesion of the plating.

DETAILED DESCRIPTION OF THE INVENTION PLATING PROCESS

Figure 1:
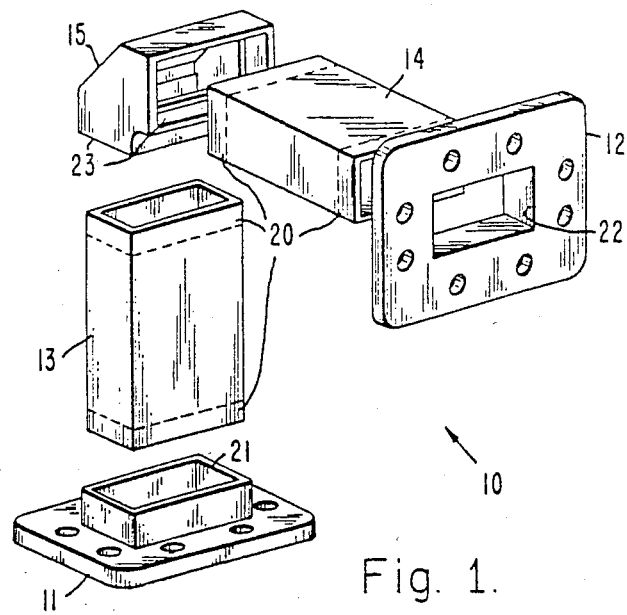
FIG. 1 is a perspective view of the parts of a 90° waveguide bend assembly having two plated plastic flanges, a plated plastic 90° bend and two aluminum rectangular waveguide sections.

Referring now to FIG. 1 with more particularity, there is a depicted a perspective view of an application of the invention to a 90° waveguide bend assembly 10. As can be seen, there are five waveguide components comprising the assembly 10, i.e., two waveguide flanges 11 and 12, two waveguide sections 13 and 14, and 90° bend 15. Whereas in the prior art these components 11-15 would be manufactured of a metallic material such as aluminum, and assembly together would be by dip brazing, the invention permits the manufacture of some or all of these components 11-15 from plated plastic materials and assembly together by dip soldering. As an example of the application of the invention, in FIG. 1 flanges 11 and 12 may be manufactured of a plated plastic, rectangular waveguide sections 13 and 14 may be manufactured of aluminum and 90° bend 15 may also be manufactured of a plated plastic.

Essential to the invention is the use of particular plastic materials for the manufacture of components such as those shown in FIG. 1. The particular plastic material used has a thermal coefficient of expansion compatible with the metallic components it will interface with such as in FIG. 1 where plated plastic flanges 11 and 12 and plated plastic 90° bend 15 interface with rectangular waveguide sections 13 and 14 which are manufactured of aluminum. Other main characteristics of the plastic used in the invention are its deflection temperature, predictability of mold shrinkage, water absorption, tensile strength, impact strength and capability of accepting plating. There is a requirement for a high deflection temperature in order to solder the plastic material in a sustained high temperature soldering process such as hot oil dip where the temperature is approximately 243° C. (470° F.). The plastic material must be capable of accepting plating with a degree of adhesion where both the substrate and its plating can be immersed in the above described hot oil bath for an extended period such as 120 seconds and not experience deformation or delamination. Plastics which are capable of satisfying the above requirements are known in the art as high temperature/high strength plastics.

In one embodiment of the invention, polyethersulfone having 30% glass fill with chopped fibers was used as the plastic substrate. This plastic has the coefficient of expansion, deflection temperature, strength and other characteristics desired for interfacing with aluminum.

In order to form the plastic into the desired shape, it is first molded by extrusion, injection, compression, machining or other techniques known in the art. Because the mold shrinkage is predictable, and water absorption is very small, polyethersulfone retains a high degree of dimensional stability.

In plating various metals on plastics, a method has been adopted by those in the art in which, generally, the plastic is first chemically plated with copper, then the resultant copper layer is thickened by electrical copper plating, and then on this surface, arbitrary metals are placed as desired.

The chemical copper plating method has long been known as a method for plating nonconductive materials and is generally referred to as preplating by electroless deposition. Before electroless depositon can occur, the surface to be plated must be prepared. This surface preparation step is critical and can determine the adhesion strength of all subsequent plating since all subsequent plating depends upon the original bond to the plastic surface. Depending upon the type of plastic to be plated by electroless depositon, there are numerous methods of surface treatment.

One generally well known method of surface treatment is to chemically etch with an acid etchant such as phosphoric acid, sulfuric acid, chromic acid or hydrochloric acid. These acids roughen the surface of certain plastics sufficiently to permit the depositon of adherent metal layers. However as discussed previously, a technique for obtaining strong adhesion values such as 10 lbs./in. on high temperature/high strength plastics, e.g., polyethersulfone, has not been available.

The chemical inertness of the molded surface of polyethersulfone makes it difficult to plate. In plating polyethersulfone, a combination of grit blasting and chemical etching render the surface chemically active such that it will accept metal plating with adhesion of over 10 lbs./in. peel strength. Grit blasting of the surface is performed with a grit abrasive such as 120 grit at a pressure such as 25 psi to achieve a uniform roughness on the surface of the molded plastic. The plastic surface is cleaned in an alkaline solution and is then neutralized by a pickling in hydrochloric acid. A chemical etch is advantageously used and is a critical step in the surface preparation process. Since polyethersulfone has a 30% glass fill with chopped fibers, a glass etchant would selectively etch away the glass content thus leaving pores in the plastic surface to accept plating. A hydrofluoric acid is a suitable etchant and in the process disclosed here, ammonium bifluoride is applied to the plastic surface in the presence of nitric acid which yields the desired etching effect.

To increase plating adhesion, a first layer of copper is added to the plastic surface by electroless deposition. After this layer is applied, the desired metal plating is accomplished by electrolytic deposition. A well known electroless copper plating bath consists of an alkaline aqueous solution containing water soluble copper salts, complexing agents and reducing agents. A catalyst is required and the surface to be plated is subjected to an activating or sensitizing treatment. Catalysts usable in the invention are: palladium chloride, palladium chloridecolloidal tin, palladium chloride-tin chloride solution and others. The last named catalyst is a mixture of palladous dichloride, stannous dichloride, stannic tetrachloride and hydrochloric acid. Additional catalyst combinations can be used in conjunction with the sensitized plastic surface and will function equally as well as the above named catalysts.

Plating adhesion has been found to be improved when the catalyst is used in a two step application, i.e., by sensitizing or priming the surface first and then by activating or seeding the surface. The steps of sensitizing and activating have been combined into one step in the prior art, however, it has been found that plating adhesion is not as great. The plastic component is then subjected to an electroless copper solution until all bare areas are covered with a copper film. This typically results in a layer thickness of a few micrometers. Examples of electroless copper baths include: (1) copper sulfate (10 gm/l), sodium hydroxide (10 gm/l), formaldehyde (37–41% W/V, 10 ml/l), and sodium potassium tartrate (50 gm/l); and (2) cupric oxide (3.0 gm/l), sodium hypophosphite (10 gm/l), and ammonium chloride (0.1 gm/l).

The surfaces may now be electrolytically plated with the desired metal. Where a thicker layer of copper is to now be plated, copper strike is applied at 40°–57° C. and 1–5 V after cleaning the surface with an acid cleaner. The layer of copper strike is cleaned with a sulfuric acid solution and a layer of acid copper is added (10–15 mins, 20–30 ASF) to obtain the desired plating thickness. A baking step anneals or heat treats the plating and results in better plating adhesion.

The following example gives a plating process for polyethersulfone. Other plastics such as polyphenylenesulfide with a 40% glass fill and polyimide-polyamide with a 40% glass fill are usable in the invention although the following plating process may vary for each plastic.

EXAMPLE OF PLATING PROCESS

Polyethersulfone (Victrex 430P), 30% glass fill, chopped fibers, was injection molded into a 90° waveguide bend similar to that shown in FIG. 1 as 90° bend 15. The following describes the plating process of the the surface of this component which resulted in a peel strength of 10.2 lbs./in.

| Step | Process | Time |
|---|---|---|
| 1 | Bake 175° ± 25° C. | 2–3 hrs. |
| 2 | Grit blast 100–200 size grit for uniform roughness | 20–50 psi |
| 3 | Electroclean 72 ± 12° C. soak cleaner, (Enbond Z-72, Enthone, Inc.) | 1–3 mins. |
| 4 | Tap water rinse | 10–120 secs. |
| 5 | Deionized water rinse | 10–120 secs. |
| 6 | HCl (pickle) 50% | immerse |
| 7 | Tap water rinse | 10–120 secs. |
| 8 | Deionized water rinse | 10–120 secs. |
| 9 | Etch (Actane 70, Enthone, Inc., Actane 70 Nitric Acid Sulfuric Acid | 1–5 mins. 120 g/l 569 g/l 490 g/l) |
| 10 | Tap water rinse | 10–120 secs. |
| 11 | Deionized water rinse | 10–120 secs. |
| 12 | Electroclean 72 ± 12° C. (Enbond Z-72, Enplate, Inc.) | 1–5 mins. |
| 13 | Tap water rinse | 10–120 secs. |
| 14 | Deionized water rinse | 10–120 secs. |
| 15 | HCl dip 22° Be | 30–120 secs. |
| 16 | Cascade deionized water rinse | 5–20 secs. |
| 17 | Sensitize (Enplate Sensitizer 432, Enthone, Inc.) | 3–6 mins. |
| 18 | Seeded rinse (one to two drops of sensitizer in step 17 added to 8.0 liters of tap water) | 55–65 secs. |
| 19 | Cascade deionized water rinse | 5–10 secs. |
| 20 | First activation no agitation | 10–30 secs. |

-continued

| Step | Process | Time |
|---|---|---|
| | (Enplate Activator 440, Enthone, Inc.) | |
| 21 | Cascade deionized water rinse | 5-20 secs. |
| 22 | Second activation | 40-150 secs. |
| | (Enplate Activator 440, Enthone, Inc.) | |
| 23 | Cascade deionized water rinse | 5-20 secs. |
| 24 | Post activation no agitation | 55-65 secs. |
| | (Enplate PA-491, Enthone, Inc.) | |
| 25 | Cascade deionized water rinse | 5-20 secs. |
| 26 | Electroless copper plate | 3-10 mins. |
| | (Enplate Cu-406, Enthone, Inc.) | |
| 27 | Cascade deionized water rinse | 15-30 secs. |
| 28 | Repeat steps 17-27 until all bare areas are completely plated with copper | |
| 29 | Copper strike 40-57° C. (CuCn, NaCN, Rochelle Salt, pH 10 ± 0.5, 10-25ASF | 1-5 mins. |
| 30 | Tap water rinse | 15-30 secs. |
| 31 | Deionized water rinse | 15-30 secs. |
| 32 | Sulfuric dip 66° Be | 10-30 secs. |
| 33 | Tap water rinse | 10-20 secs. |
| 34 | Deionized water rinse | 10-30 secs. |
| 35 | Acid copperplate 20-30 ASF (Sel-Rex Cubath and Sel-Rex Cubath M-H, Oxy Metal Ind., Buena Park, CA.) | 10-15 mins. |
| 36 | Tap water rinse | 10-20 secs. |
| 37 | Deionized water rinse | 10-30 secs. |
| 38 | Hot deionized water rinse 60-95° C. | 10-30 secs. |
| 39 | Blow dry (compressed air or nitrogen) | |
| 40 | Bake 140° ± 20° C. | 2-3 hrs. |
| 41 | Acid cleaner | 10-30 secs. |
| | (Meteax L5-B, MacDermidt, Inc. Torrance, CA) | |
| 42 | Tap water rinse | 10-120 secs. |
| 43 | Deionized water rinse | 15-30 secs. |
| 44 | Copper strike - as in step 29 | 30-60 secs. |
| 45 | Tap water rinse | 10-120 secs. |
| 46 | Deionized water rinse | 10-120 secs. |
| 47 | Sulfuric dip 66° Be | 10-30 secs. |
| 48 | Tap water rinse | 10-120 secs. |
| 49 | Deionized water rinse | 10-120 secs. |
| 50 | Acid copper plate 20-30 ASF (as in step 35) | as required |
| 51 | Tap rinse | 10-120 secs. |
| 52 | Deionized water rinse | 10-120 secs. |
| 53 | Hot deionized water rinse (as in step 38) | 10-20 secs. |
| 54 | Blow dry (compressed air or nitrogen) | |
| 55 | Bake 100° ± 20° C. | 1-2 hrs. |
| 56 | Bake 185° ± 20° C. | 3-5 hrs. |

SOLDERING PROCESS

The basic soldering technique described herein is solder reflow. In particular, two implementations of solder reflow are described; i.e., solder foil and solder preplating. In regard to the heat medium, a hot oil, dip soldering technique yields the strongest solder joints, however, vapor phase soldering is also a useful technique. For a description of vapor phase soldering, refer to H. H. Manko, *Solders and Soldering*, 2d, McGraw-Hill, 1979, pp. 209-210. It has been found that vapor phase soldering yields a good joint between soldered parts; however, the tensile strength of a joint soldered in accordance with the following hot oil, dip process was found to be twice as strong as one soldered by a vapor phase process. In addition, the size of the typical vapor phase chamber is relatively small which may cause manufacturing production difficulties when large assemblies are to be soldered.

Use of a heat gun to cause solder reflow is useful but has been limited to repair of component assemblies. One of the advantages of the invention is that repairs can be effected due to the relatively low temperatures to which the plated plastic parts and interfacing metal parts (if any) are subjected. As previously discussed, a dip brazing technique subjected the parts to much greater heat (above 538° C.) and distortion of the metallic components would result. Repair of a brazed joint was not possible without some distortion or damage to the part.

A new hot oil, dip soldering process has been formulated which yields solder joints stronger than the underlying metal plating adhesion to the plastic substrate. A waveguide component assembly 10 as shown in FIG. 1 of plated plastic flanges 11 and 12 and plated plastic 90° bend 15 with plated aluminum rectangular waveguide sections 13 and 14 was soldered in accordance with the invention and resulted in the assembly 30 shown in FIG. 2. Shear strength of the solder joints exceeded 5600 psi which was greater than the shear strength of the underlying metal plating to the plastic.

In the invention, the hot oil dip soldering process basically has the steps of: surface preparation by drying, fluxing the surfaces to be mated, applying the solder foil or preplating the surfaces with solder, assembling the components to be soldered, masking the surfaces from solder as desired, immersing the assembly in the hot oil, rinsing the assembly and drying the assembly.

In order to solder the aluminum waveguide sections 13 and 14, they must first be plated with a solderable metal material such as copper. Processes for plating aluminum are known in the art and no further description is given other than to describe a general process for using aluminum herein. The aluminum section 13 for example, is first plated with nickel by electroless deposition after cleaning, etching and deoxidizing. The nickel plated aluminum section 13 may now be plated with copper if desired, by electrolytic deposition. Thereafter, the plated aluminum section 13 may be plated with tin lead solder, assembled with the other components, i.e., flange 11 and 90° bend 15 and hot oil, dip soldered. Thereafter, the remaining tin lead and electroless nickel can be stripped from the aluminum using nitric acid or other means if desired. Where solder foil is to be used, plating the aluminum with tin lead becomes unnecessary.

Before soldering, the parts are dried by baking. Water removal is an essential step in obtaining a strong solder joint. The parts are then fluxed in the areas to be joined which are shown in FIG. 1 by broken lines around areas 20, 21, 22 and 23. The proper choice of solder flux is critical since some fluxes react adversely to the hot oil. Some fluxes will not flow in the presence of hot oil and some will ball up which renders them useless. Activated rosin fluxes provide the best solder coverage. Some trade names found usable are: Multicore 366A Activated, Multicore 5381 Mildly Activated, Redox 410-35 and Kester 197.

Solder is then applied to the components, either in the form of solder foil, solder preplating, solder paste, etc. Where solder foil is used, the foil pieces are placed in the female sockets of the parts to be joined. The foil thickness used in one embodiment was 3.5±0.5 mil and the foil should be wider than the width of the joint to obtain a fully soldered joint.

The components are assembled and aligned with a suitable holding fixture which applies pressure to keep the parts in position. The assembly is then solder masked in areas which are to be kept free of solder. To avoid thermal shock, the assembled components are then warmed in prefuse oil by dipping. The temperature is kept below the melting point of the solder used and has the effect of bringing the temperatures of all the components, flux and solder into equilibrium at a temperature closer to the fusing oil. The assembly is dipped into the fusing oil which may have a temperature in the range of 232°–260° C. (450°–500° F.) with an optimum temperature of 243°±6° C. (470°±10° F.). Many types of oils are usable as fusing oil, including peanut oil. For a chart of oils, refer to H. H. Manko, cited above. The assembly is left in the oil until all components have fused which typically requires approximately 60 seconds, although the time will vary depending upon the size of the solder joints, the size of the components, etc. The assembly is then cooled by transferring back to the prefuse oil to avoid thermal shock. The assembly is now rinsed to remove flux and solder mask and is dried.

An example of a dip soldering process used on polyethersulfone is disclosed below. In addition to polyethersulfone accepting plating with good adhesion, it has other characteristics which make it attractive in an application with aluminum. Polyethersulfone with 30% glass fill has substantially the same thermal coefficient of expansion and strength characteristics as aluminum. In addition, it has little mold shrinkage, and is very predictable as well as having little water absorption.

EXAMPLE OF HOT OIL DIP SOLDERING

The hot oil dip soldering process disclosed herein was performed on a waveguide assembly similar to that shown in FIG. 1 where flanges 11 and 12 and 90° bend 15 were plated polyethersulfone and rectangular waveguide sections 13 and 14 were copper plated aluminum. The plated plastic components were manufactured in accordance with the plating process previously described. The following describes the steps taken in this embodiment:

| Step | Process | Time |
|---|---|---|
| 1 | Bake 110° ± 10° C. | 3–4 hrs. |
| 2 | Flux swab on surfaces to be joined (Solder Flux 820, J&S Laboratories, Inc.) | |
| 3 | Solder foil 60/40 tin-lead solder assembly | |
| 4 | Components assembly/alignment | |
| 5 | Solder Mask (Alpha 110 Solder Mask, Alpha Metals, Inc.) | |
| 6 | Prefusing oil dip 93–116° C. (Kenco Reflow Fluid, Kenco, Inc.) | 20–40 secs. |
| 7 | Fusing dip 237–260° C. (Kenco Reflow Fluid, Kenco, Inc.) | 30–120 secs. (as required for complete reflow) |
| 8 | Post fusing oil dip 93–116° C. (Kenco Reflow Fluid, Kenco, Inc.) | 20–40 secs. |
| 9 | Drain excess oil | 10–30 secs. |
| 10 | Hot water spray rinse - remove fusing oil and solder mask | as required |
| 11 | Tap water rinse | 10–60 secs. |
| 12 | Deionized water spray rinse | 10–60 secs. |
| 13 | Hot deionized 79° ± 14° C. water rinse | 10–30 secs. |
| 14 | Blow dry (compressed air or nitrogen) | |

Figure 2:
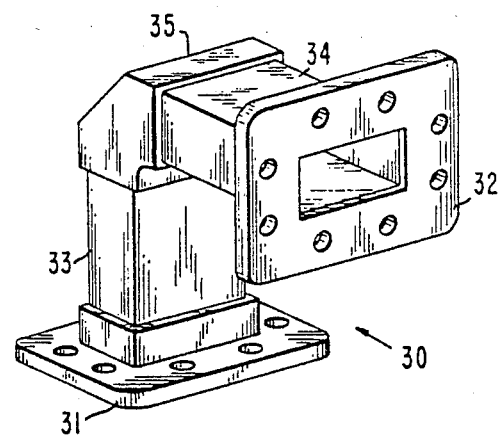
FIG. 2 is a perspective view of the parts of FIG. 1 after assembly by the dip soldering process disclosed herein.

Thus, an assembly such as that shown in FIG. 2 where the flanges 31 and 32 and the bend elbow 35 are plated plastic material and the waveguide sections 33 and 34 are plated aluminum, can be manufactured using the invention. This assembly has the advantages of lowered weight since plated plastic is used in three parts instead of a metal, and the device is of much lower cost since the plastic used, such as polyethersulfone, is typically less expensive than aluminum. The components may be disassembled, repaired, and then reassembled nondestructively through use of the hot oil dip soldering process in reverse or by using a heat gun or other techniques as previously discussed. The polyethersulfone components in this embodiment are approximately 40% lighter than aluminum. Since plastic materials can be injection molded or extruded, complex components are more easily fabricated than with metal. Also, better repeatability of results in fabrication is obtainable. There are fewer variances since the behavior of the plastic during the fabrication process is highly predictable, more so than dip brazed aluminum.

Initial tooling cost for manufacturing plastic components is typically approximately the same as for manufacturing metal components, however, the overall cost of the plastic components manufactured in accordance with the invention decreases substantially as the quantity increases since generally, more can be made from the tooling. Complex parts are more readily and accurately reproducible with plastic than with metals once the tooling is completed. For example, in small quantities using polyethersulfone, the price ratio may be 5:1 in favor of the plastic, and for large quantities, the price ratio increases considerably.

Components and assemblies made in accordance with the invention are rugged and perform well, both electrically and mechanically. They are lighter and less expensive than metal components. Although the invention has been described and illustrated in detail, this is by way of example only and is not meant to be taken by way of limitation. Modifications to the above description and illustration of the invention may occur to those skilled in the art, however, it is the intention that the scope of the invention should include such modifications unless specifically limited by the claims. For example, the plating process has been described in terms of electrolytic plating of a thick copper layer. It may be found that a thick nickel, silver or gold electrolytic layer is more suitable for the particular application. Likewise, the composition of the solder used in the dip soldering process may vary from tin lead to other suitable types. The invention has been described and drawn in a waveguide embodiment. This is not meant to limit the invention in any way, the invention has wide application to many fields of art.

What is claimed is:

1. A solder reflow process for forming an integrated assembly of mutually supportive articles soldered together wherein at least one article comprises a metal plated plastic material, the process comprising the steps of:
   a. providing a metal plated plastic article comprising a plastic having a coefficient of thermal expansion compatible with the article to which the plastic article is to be soldered, and formed by a process comprising the steps of:
      i. selecting a plastic having a deflection temperature and a melting temperature of at least 204° C. and having a predetermined amount of glass fill;
      ii. forming the plastic into the article shape;
      iii. roughening the surface of the article by means of physical abrasion;
      iv. exposing the roughened surface of the formed article to a chemical etch solution comprising ammonium bifluoride, nitric acid, and sulfuric acid;
      v. chemically depositing a first layer of conductive metal on the chemically etched surface of the article; and vi. electrolytically depositing a second layer of metal on the first layer of conductive metal;
b. drying the plated plastic article;
c. assembling the articles together;
d. applying flux to the articles;
e. applying solder to the articles; and
f. immersing the assembled articles in the heat medium for a time period which is long enough to permit complete solder reflow.

2. The process as set forth in claim 1 wherein the heat medium comprises hot oil at a temperature within the range of 204° to 260° C.

3. The process as set forth in claim 1 wherein the plated plastic material comprises polyethersulfone.

4. The process as set forth in claim 1 wherein the step of applying solder comprises preplating the articles to be joined with a film of solder.

5. The process as set forth in claim 1 wherein the step of applying solder comprises inserting solder foil between the surfaces to be mated.

6. The process as set forth in claim 1 wherein the heat medium comprises the technique of vapor phase soldering.

7. A process for soldering a metal plated plastic article to a metal article to form an integrated structure of mutually supportive articles, comprising the steps of:
providing a high temperature/high strength plastic having a coefficient of thermal expansion compatible with the metal article to which the metal plated plastic article is to be soldered and having a deflection temperature and a melting temperature of at least 204° C. and having a predetermined amount of glass fill;
forming the plastic into the article shape;
plating the plastic article with metal by a process comprising the steps of:
  a. roughening the surface of the article by means of physical abrasion;
  b. exposing the roughened surface of the formed article to a chemical etch solution comprising ammonium bifluoride, nitric acid, and sulfuric acid;
  c. chemically depositing a first layer of conductive metal on the chemically etched surface of the article; and
  d. electrolytically depositing a second layer of metal on the first layer of conductive metal;
removing water from the metal plated plastic article;
applying flux to selected surfaces of the metal plated plastic article and to selected surfaces of the metal article to which it is to be soldered;
applying solder to the fluxed surfaces;
assembling the metal plated plastic article with the metal article to which it is to be soldered;
completely immersing the assembled articles in hot oil having a temperature of at least the melting temperature of the solder; and
removing the assembled articles from the hot oil after a time period which is selected to be long enough so that the solder reflows.

8. The process of claim 7 wherein the plastic provided comprises glass fill with chopped fibers, the amount of which is selected such that the coefficient of thermal expansion of the plastic with the glass fill is compatible with the article to which it is to be soldered.

9. The process of claim 7 wherein the temperature of the hot oil is at least 232° C. and the time period of immersion of the assembled articles is at least 60 seconds.

10. The process of claim 7 wherein the plastic provided is selected from the group consisting of polyethersulfone having approximately 30% glass fill, polyphenylene sulfide having approximately 40% glass fill, and polyimide-polyamide having approximately 40% glass fill.

11. The process of claim 7 wherein the step of removing water from the metal plated plastic article comprises baking the article at an elevated temperature for a time period selected so that substantially all water is removed.

12. The process of claim 7 wherein the flux comprises activated rosin.

13. The process of claim 7 wherein the step of applying solder comprises placing a selected amount of solder foil between the fluxed surfaces of the articles.

14. The process of claim 7 wherein the step of applying solder comprises pre-plating selected fluxed surfaces with solder prior to assembly.

15. The process of claim 7 wherein the step of applying solder comprises placing a selected amount of solder paste on selected fluxed surfaces.

16. A solder reflow process for soldering a metal plated plastic article to another article to form an integrated structure of mutually supportive articles, comprising the steps of:
providing a substrate comprising polyethersulfone impregnated with a selected amount of glass fill with chopped fibers, the amount selected so that the coefficient of thermal expansion of the polyethersulfone with the glass fill is compatible with the article to which it is to be soldered;
forming the plastic into the article shape;
plating the plastic article with metal by a process comprising the steps of:
  a. roughening the surface of the article by means of physical abrasion;
  b. exposing the roughened surface of the formed article to a chemical etch solution comprising ammonium bifluoride, nitric acid, and sulfuric acid;
  c. chemically depositing a first layer of conductive metal on the chemically etched surface of the article; and
  d. electrolytically depositing a second layer of metal on the first layer of conductive metal;
removing substantially all water from the metal plated plastic article;
applying flux to selected surfaces of the metal plated plastic article and to selected surfaces of the article to which it is to be soldered;
applying solder to the fluxed surfaces;
assembling the metal plated plastic article with the article to which it is to be soldered;
completely immersing the assembled articles in hot oil having a temperature of at least the melting temperature of the solder; and
removing the assembled articles from the hot oil after a time period which is selected to be long enough so that the solder reflows.

17. The process of claim 16 wherein said other article is fabricated from aluminum and the amount of glass fill with chopped fibers is selected to be approximately 30% whereby the coefficient of thermal expansion of the polyethersulfone with glass fill is compatible with aluminum.

18. The process of claim 17 wherein the temperature of the hot oil is at least 232° C. and the time period of immersion of the articles is at least 60 seconds.

19. The process of claim 16 wherein the step of removing water from the metal plated plastic article comprises baking the article at an elevated temperature for a time period selected so that substantially all water is removed.

20. A solder reflow process for soldering a metal plated plastic article to another article to form an integrated structure of mutually supportive articles, comprising the steps of:
providing a substrate comprising polyphenylene sulfide impregnated with a selected amount of glass fill with chopped fibers, the amount selected so that the coefficient of thermal expansion of the polyphenylene sulfide with the glass fill is compatible with the article to which it is to be soldered;
forming the plastic into the article shape;
plating the plastic article with metal by a process comprising the steps of:
 a. roughening the surface of the article by means of physical abrasion;
 b. exposing the roughened surface of the formed article to a chemical etch solution comprising ammonium bifluoride, nitric acid, and sulfuric acid;
 c. chemically depositing a first layer of conductive metal on the chemically etched surface of the article; and
 d. electrolytically depositing a second layer of metal on the first layer of conductive metal;
removing substantially all water from the metal plated plastic article;
applying flux to selected surfaces of the metal plated plastic article and to selected surfaces of the article to which it is to be soldered;
applying solder to the fluxed surfaces;
assembling the metal plated plastic article with the article to which it is to be soldered;
completely immersing the assembled articles in hot oil having a temperature of at least the melting temperature of the solder; and
removing the assembled articles from the hot oil after a time period which is selected to be long enough so that the solder reflows.

21. The process of claim 20 wherein said other article is fabricated from aluminum and the amount of glass fill with chopped fibers is selected to be approximately 40% whereby the coefficient of thermal expansion of the polyphenylene sulfide with glass fill is compatible with aluminum.

22. The process of claim 21 wherein the temperature of the hot oil is at least 232° C. and the time period of immersion of the articles is at least 60 seconds.

23. The process of claim 20 wherein the step of removing water from the metal plated plastic article comprises baking the article at an elevated temperature for a time period selected so that substantially all water is removed.

24. A solder reflow process for soldering a metal plated plastic article to another article to form an integrated structure of mutually supportive articles, comprising the steps of:
providing a substrate comprising polyimide-polyamide impregnated with a selected amount of glass fill with chopped fibers, the amount selected so that the coefficient of thermal expansion of the polyimide-polyamide with the glass fill is compatible with the article to which it is to be soldered;
forming the plastic into the article shape;
plating the plastic article with metal by a process comprising the steps of:
 a. roughening the surface of the article by means of physical abrasion;
 b. exposing the roughened surface of the formed article to a chemical etch solution comprising ammonium bifluoride, nitric acid, and sulfuric acid;
 c. chemically depositing a first layer of conductive metal on the chemically etched surface of the article; and
 d. electrolytically depositing a second layer of metal on the first layer of conductive metal;
removing substantially all water from the metal plated plastic article;
applying flux to selected surfaces of the metal plated plastic article and to selected surfaces of the article to which it is to be soldered;
applying solder to the fluxed surfaces;
assembling the metal plated plastic article with the article to which it is to be soldered;
completely immersing the assembled articles in hot oil having a temperature of at least the melting temperature of the solder; and
removing the assembled articles from the hot oil after a time period which is selected to be long enough so that the solder reflows.

25. The process of claim 24 wherein said other article is fabricated from aluminum and the amount of glass fill with chopped fibers is selected to be approximately 30% whereby the coefficient of thermal expansion of the polyimide-polyamide with glass fill is compatible with aluminum.

26. The process of claim 25 wherein the temperature of the hot oil is at least 232° C. and the time period of immersion of the articles is at least 60 seconds.

27. The process of claim 24 wherein the step of removing water from the metal plated plastic article comprises baking the article at an elevated temperature for a time period selected so that substantially all water is removed.

28. A solder reflow process for forming an assembly of microwave components which are soldered together by exposing the components to a heat medium, wherein at least one component comprises a metal plated plastic material, the process comprising the steps of:
a. providing a metal plated plastic microwave component comprising a plastic having a coefficient of thermal expansion compatible with the component to which the plastic component is to be soldered and formed by a process comprising the steps of:
 i. selecting a plastic having a deflection temperature and a melting temperature of at least 204° C. and having a predetermined amount of glass fill;
 ii. forming the plastic into the article shape;
 iii. roughening the surface of the article by means of physical abrasion;
 iv. exposing the roughened surface of the formed article to a chemical etch solution comprising ammonium bifluoride, nitric acid, and sulfuric acid;
 v. chemically depositing a first layer of conductive metal on the chemically etched surface of the article; and
 vi. electrolytically depositing a second layer of metal on the first layer of conductive metal;
b. drying the plated plastic microwave component;
c. assembling the microwave components together;
d. applying flux to the microwave components;
e. applying solder to the microwave components; and f. immersing the assembled microwave components in the heat medium for a time period which is long enough to permit complete solder reflow.

29. The process as set forth in claim 28 wherein the heat medium comprises hot oil at a temperature within the range of 204° C. to 260° C.

30. The process as set forth in claim 28 wherein at least one of said microwave components is fabricated from metal, and said plastic material has a coefficient of thermal expansion compatible with the metal from which said metal component is fabricated.

31. The process as set forth in claim 30 wherein said metal component is fabricated from aluminum, and wherein said plastic material is a high temperature/high strength plastic having a coefficient of thermal expansion compatible with aluminum.

32. The process as set forth in claim 28 wherein the plastic material comprises glass fill with chopped fibers, the amount of which is selected such that the coefficient of thermal expansion of the plastic with the glass is compatible with the coefficient of thermal expansion of the component to which it is to be soldered.

33. The process as set forth in claim 28 wherein said microwave components comprise waveguide elements, and said assembly comprises a waveguide assembly.

34. A solder reflow process for soldering waveguide components together to form a waveguide assembly by exposing the components to a heat medium, wherein at least one component comprises a metal plated plastic material, the process comprising the steps of:

providing a high temperature/high strength plastic having a coefficient of thermal expansion compatible with the component to which it is to be soldered and having a deflection temperature and a melting temperature of at least 204° C. and having a predetermined amount of glass fill;

forming the plastic into the component shape;

plating the plastic component with metal by a process comprising the steps of:
  a. roughening the surface of the article by means of physical abrasion;
  b. exposing the roughened surface of the formed article to a chemical etch solution comprising ammonium bifluoride, nitric acid, and sulfuric acid;
  c. chemically depositing a first layer of conductive metal on the chemically etched surface of the article; and
  d. electrolytically depositing a second layer of metal on the first layer of conductive metal;

removing water from the metal plated plastic component;

applying flux to selected surfaces of the metal plated plastic component and to selected surfaces of the component to which it is to be soldered;

applying solder to the fluxed surfaces;

assembling the metal plated plastic component with the component to which it is to be soldered;

completely immersing the assembled components in hot oil having a temperature of at least the melting temperature of the solder; and removing the assembled components from the hot oil after a time period which is selected to be long enough so that the solder reflows.

35. The process as set forth in claim 34 wherein the heat medium comprises hot oil at a temperature within the range of 204° C. to 260° C.

36. The process as set forth in claim 34 wherein the plated plastic component comprises polyethersulfone.

37. The process as set forth in claim 34 wherein the plastic material comprises glass fill with chopped fibers, the amount of which is selected such that the coefficient of thermal expansion of the plastic with the glass fill is compatible with the component to which it is to be soldered.

38. The process as set forth in claim 37 wherein said plastic material is selected from the group consisting of polyethersulfone having approximately 30% glass fill, polyphenylene sulfide having approximately 40% glass fill, and polyimide-polyamide having approximately 40% glass fill.

39. The process as set forth in claim 34 wherein the step of removing water from the metal plated component comprises baking the component at an elevated temperature for a time period selected so that substantially all water is removed.

40. The process as set forth in claim 34 wherein the flux comprises activated resin.

41. The process as set forth in claim 34 wherein the step of applying solder comprises placing a selected amount of solder foil between the fluxed surfaces of the components.

42. The process as set forth in claim 34 wherein the step of applying solder comprises pre-plating selected fluxed surfaces with solder prior to assembly.

43. The process as set forth in claim 34 wherein the step of applying solder comprises placing a selected amount of solder paste on selected fluxed surfaces.

* * * * *